(12) United States Patent
Van Andel (10) Patent No.: US 7,830,658 B2
(45) Date of Patent: Nov. 9, 2010

(54) HOUSING WITH COOLING FOR ELECTRONIC EQUIPMENT

(75) Inventor: Eleonoor Europeo Van Andel, Almelo (NL)

(73) Assignee: Fiwihex B.V., Almelo (NL)

( * ) Notice: Subject to any disclaimer, the term of this patent is extended or adjusted under 35 U.S.C. 154(b) by 0 days.

(21) Appl. No.: 11/922,363

(22) PCT Filed: Jun. 18, 2006

(86) PCT No.: PCT/NL2006/050139

§ 371 (c)(1),
(2), (4) Date: Feb. 11, 2009

(87) PCT Pub. No.: WO2006/135239

PCT Pub. Date: Dec. 21, 2006

(65) Prior Publication Data

US 2009/0296346 A1    Dec. 3, 2009

(30) Foreign Application Priority Data

Jun. 17, 2005   (NL) .................................. 1029280

(51) Int. Cl.
*H05K 7/20* (2006.01)
(52) U.S. Cl. .................. 361/679.53; 361/679.46; 361/679.47; 361/696; 361/698; 165/104.14; 165/104.34; 165/171; 454/184
(58) Field of Classification Search ........... 361/679.46, 361/679.47, 679.49, 679.53, 690, 697, 689, 361/699–702, 722–727, 730, 831; 165/80.4, 165/104.21, 104.34, 185, 104.14, 121, 122, 165/150, 171, 76, 79, 184; 454/184; 62/230, 62/259.1, 259.2, 263, 298; 312/223.2, 223.3, 312/198, 201, 199, 334.24, 334.25
See application file for complete search history.

(56) References Cited

U.S. PATENT DOCUMENTS

| | | | |
|---|---|---|---|
| 46,596 A | | 2/1865 | Somes |
| 2,268,680 A | * | 1/1942 | Von Linde .................. 165/184 |
| 2,469,435 A | | 5/1949 | Hirsch |
| 2,620,170 A | | 12/1952 | Brickman |

(Continued)

FOREIGN PATENT DOCUMENTS

| | | | |
|---|---|---|---|
| DE | 2138376 A1 | | 2/1973 |
| DE | 8433131 U | * | 4/1985 |
| DE | 19606727 | * | 8/1997 |
| DE | 19806207 | * | 8/1999 |

(Continued)

*Primary Examiner*—Michael V Datskovskiy
(74) *Attorney, Agent, or Firm*—The Webb Law Firm (57) ABSTRACT

A housing for electronic equipment comprises a heat exchanger for exchanging heat between a liquid-containing medium and a gas. This heat exchanger comprises a medium inlet and a medium outlet and a flat heat exchanger mat. The mat comprises a number of parallel, equidistant capillaries of heat-conducting material and wires of heat-conducting material which are attached in heat-conducting contact to the capillaries, extend in transverse direction relative thereto and have a mutual distance in the order of magnitude of the diameter of the wires, wherein air can flow along the wires for heat exchange between this air and the medium flowing through the capillaries. The heat exchanger is embodied such that the air flows along the mat and at least a substantial part of the air is prevented from flowing through the mat, and that it is ensured that the air flows along the wires in longitudinal direction of these wires.

24 Claims, 9 Drawing Sheets

U.S. PATENT DOCUMENTS

| | | | |
|---|---|---|---|
| 2,667,762 A | | 2/1954 | Homaday |
| 2,705,877 A | | 4/1955 | King |
| 2,706,105 A | | 4/1955 | Young |
| 3,368,617 A | | 2/1968 | Rosman et al. |
| 3,450,194 A | | 6/1969 | Barthel |
| 3,460,225 A | * | 8/1969 | Beauvais .................. 29/890.07 |
| 3,559,728 A | * | 2/1971 | Lyman et al. ................ 165/55 |
| 3,788,388 A | * | 1/1974 | Barkmann .................. 165/272 |
| 3,807,493 A | * | 4/1974 | Stewart ................. 165/104.14 |
| 4,027,998 A | * | 6/1977 | Schwartz .................. 415/213.1 |
| 4,258,780 A | | 3/1981 | Suo |
| 4,449,579 A | * | 5/1984 | Miyazaki et al. ....... 165/104.33 |
| 4,454,862 A | | 6/1984 | Kamanaka |
| 4,600,050 A | * | 7/1986 | Noren ................... 165/104.14 |
| 4,706,739 A | * | 11/1987 | Noren ................... 165/104.14 |
| 4,802,060 A | * | 1/1989 | Immel ........................ 361/678 |
| 4,911,231 A | * | 3/1990 | Horne et al. ........... 165/104.34 |
| 4,949,218 A | * | 8/1990 | Blanchard et al. ........... 361/696 |
| 4,960,169 A | | 10/1990 | Granetzke |
| 5,035,281 A | * | 7/1991 | Neuenfeldt et al. ........... 165/76 |
| 5,054,545 A | * | 10/1991 | Ghaemian .............. 165/104.33 |
| 5,123,483 A | | 6/1992 | Tokutake et al. |
| 5,428,973 A | * | 7/1995 | Temmyo et al. ................ 62/452 |
| 5,502,983 A | * | 4/1996 | Dasher ........................ 62/454 |
| 5,579,834 A | | 12/1996 | Chiba |
| 5,603,376 A | * | 2/1997 | Hendrix ................. 165/104.34 |
| 5,647,431 A | | 7/1997 | Takeshita et al. |
| 5,657,641 A | * | 8/1997 | Cunningham et al. ......... 62/263 |
| 5,704,421 A | | 1/1998 | Takeshita et al. |
| 5,718,628 A | * | 2/1998 | Nakazato et al. ............ 454/184 |
| 5,738,166 A | * | 4/1998 | Chou .................... 165/104.21 |
| 5,765,743 A | * | 6/1998 | Sakiura et al. ............. 236/49.3 |
| 5,806,585 A | * | 9/1998 | Yoshida et al. .............. 165/171 |
| 5,822,854 A | * | 10/1998 | Ikejima et al. ......... 29/890.047 |
| 5,832,992 A | | 11/1998 | Van Andel |
| 5,964,284 A | * | 10/1999 | Ikejima et al. ............... 165/171 |
| 6,024,165 A | * | 2/2000 | Melane et al. ......... 165/104.33 |
| 6,039,111 A | * | 3/2000 | Kawaguchi et al. .... 165/104.14 |
| 6,065,531 A | * | 5/2000 | Schneider et al. ........... 165/122 |
| 6,192,976 B1 | * | 2/2001 | Yoshida et al. ............... 165/171 |
| 6,222,730 B1 | * | 4/2001 | Korvenheimo et al. ...... 361/696 |
| 6,538,883 B1 | | 3/2003 | Greer |
| 6,543,529 B2 | | 4/2003 | Ohgaki |
| 6,575,230 B1 | * | 6/2003 | Kadota et al. .......... 165/104.33 |
| 6,640,885 B2 | * | 11/2003 | Jenkins, Jr. ................. 165/171 |
| 6,651,452 B2 | * | 11/2003 | Lecke et al. ................... 62/230 |
| 6,671,212 B2 | * | 12/2003 | Macri et al. ............ 365/189.07 |
| 6,705,043 B1 | | 3/2004 | Opdam et al. |
| 6,742,583 B2 | * | 6/2004 | Tikka ........................ 165/291 |
| 6,789,612 B1 | * | 9/2004 | Okamoto et al. ....... 165/104.34 |
| 6,804,114 B1 | | 10/2004 | Greer |
| 6,896,612 B1 | * | 5/2005 | Novotny ..................... 454/184 |
| 7,089,998 B2 | * | 8/2006 | Crook ......................... 165/79 |
| 7,100,682 B2 | * | 9/2006 | Okamoto et al. ....... 165/104.34 |
| 7,222,660 B2 | * | 5/2007 | Giacoma et al. .............. 165/47 |
| 7,367,384 B2 | * | 5/2008 | Madara et al. ............. 165/122 |
| 7,385,810 B2 | * | 6/2008 | Chu et al. .............. 361/679.48 |
| 7,534,167 B2 | * | 5/2009 | Day ............................. 454/187 |
| 7,571,760 B2 | * | 8/2009 | Lee et al. .................... 165/150 |
| 7,588,028 B2 | | 9/2009 | Scott |
| 2002/0173266 A1 | | 11/2002 | Sharp et al. |
| 2005/0005528 A1 | * | 1/2005 | Brault et al. |
| 2007/0151718 A1 | * | 7/2007 | Youn et al. |
| 2008/0142197 A1 | * | 6/2008 | Van Andel et al. |

FOREIGN PATENT DOCUMENTS

| | | | |
|---|---|---|---|
| EP | 0469563 A2 | * | 2/1992 |
| EP | 0735328 A2 | | 10/1996 |
| EP | 0864835 A1 | * | 9/1998 |
| GB | 620291 | | 3/1949 |
| JP | 57052729 | | 3/1982 |
| JP | 61153388 A | | 7/1986 |
| JP | 04316930 | | 11/1992 |
| JP | 09004867 | | 1/1997 |
| JP | 2003161587 A | * | 6/2003 |
| JP | 02004018284 A | * | 1/2004 |
| NL | 9301439 A | | 3/1995 |
| NL | 1012114 C | | 11/2000 |
| WO | 9505570 A1 | | 2/1995 |
| WO | 2006104390 A1 | | 10/2006 |

\* cited by examiner fig.1 fig.2 fig.3 fig.4 fig.5 fig.6 fig.7 fig.8 fig. 9 fig. 10 fig. 11 fig. 12 fig. 13 fig. 14

HOUSING WITH COOLING FOR ELECTRONIC EQUIPMENT

The invention relates to a housing according to the heading of claim 1.

A housing of this type can be both a casing and a space in a building in which electronic equipment is disposed.

Such a housing is for instance known from U.S. Pat. No. 6,538,883 and U.S. Pat. No. 6,804,114. These documents disclose a heat exchanger for absorbing heat from the air circulating in the housing and discharging thereof to a surrounding area, in particular the underlying earth. No specification whatsoever is given of the heat exchanges in question.

In this respect the invention is based on the insight that for the purpose of a practical applicability of cooling in a housing for heat-generating electronic equipment it is necessary to make the heat exchanger as compact as possible. It is of course not possible to simply reduce the size of an existing heat exchanger, for instance a fin-tube heat exchanger, since this has an adverse effect on the cooling capacity. It must therefore be deemed essential that the heat exchanger is of a specific type which has a better ratio between cooling capacity and the volume taken up by the heat exchanger.

A heat exchanger whose application could be considered in the context of the housing according to the invention is for instance known from JP-A-61-153388 (Kokai) and from EP-A-0 735 328.

In the heat exchangers known from these publications the gas flows through the openings of the mat formed by the capillaries and the wires. As a result the gas flowing through the heat exchanger undergoes a considerable flow resistance. This flow resistance must be overcome by guiding the gas flow through the heat exchanger under the influence of fan means. The electric power required for this purpose results in an undesirable effective reduction in the performance of the heat exchanger.

In the known heat exchangers it is in addition not possible to prevent dust accumulating in the mats within a very short time. The heat exchanger hereby becomes blocked in a very short time. The design performance can be temporarily restored again only by maintenance or blowback of gas, and thus cleaning of the mat.

It is an object of the invention to greatly improve the efficiency of the cooling of the housing and to make the heat exchanger substantially maintenance-free. It is also an object of the invention to reduce to a minimum the sound emission caused by the normally present fan for causing circulation of the air.

With a view hereto the invention provides a housing of the described type which has the feature of claim 1.

A possible practical embodiment of the housing is specified in claim 2.

Claim 3 relates to the possibility of connecting the wires to the capillaries by means of a weaving process according to the teaching of the invention.

Claim 4 relates to an alternative wherein the wires are not connected to the capillaries by means of a weaving process, but wherein the wires are attached to the capillaries in mutually parallel relation on either side of these capillaries. Compared to the structure according to claim 3, the structure according to claim 4 has the great advantage that the centre-to-centre distance between the capillaries can be considerably smaller, which improves the performance of the heat exchanger still further. In the case of claim 3 for instance the heat exchanger can meet the specification as according to claim 13, and in the case of claim 4 the heat exchanger can meet the specification of claim 14.

Claim 5 relates to the possibility of parallel connection of groups of in each case a number, preferably an equal number, of capillaries and collective connection thereof to respectively an inlet manifold and an outlet manifold of the group. The inlet manifold can also form part of the outlet manifold of a preceding group of capillaries, while the outlet manifold can form part of an inlet manifold of a following group of capillaries. It will be apparent that the relevant aligned manifolds must be thermally separated from each other, because there is after all a temperature difference between the two during operation.

An important alternative is specified in claim 6. In this embodiment the capillaries are connected in series to each other, no use is made of an inlet manifold and an outlet manifold and the medium in adjacent capillaries flows in mutually opposite directions. This embodiment provides a greater flow resistance to the through-flowing medium than for instance the embodiment of claim 5, but has the advantage of being able to suffice with a very small volume of medium. Particularly in the case where this medium has harmful or hazardous properties, such as CFCs for air-conditioning systems, propane and the like, the quantity of medium in a heat exchanger, even if it comprises a plurality of mats, can be negligible and amount to for instance only a few tens of milliliters. In the embodiment where use is made of manifolds the quantity of medium present in the heat exchanger is substantially greater, for instance in the order of liters. It is conceivable that such a heat exchanger does not even meet the requirements set down by legal regulations, and it is therefore not suitable for the relevant application.

Claim 7 describes that the embodiment according to claim 6 requires mechanical strengthening in some circumstances, since a zigzag-modelled capillary tube does after all only have a very limited mechanical stiffness.

The embodiment according to claim 8 relates to a practical aspect of the invention. The perforations can be arranged in any suitable manner in the relevant tube. Use can for instance be made of drilling, piercing with a punch or the like, or flow drilling. Instead of a tube, the air duct wall can also be provided with slit-like holes not extending through the wall, for instance by vacuum-forming or injection moulding, into which the U-bends fit so that the mats become stiff and have mutually equal interspacing.

An important further development of claim 6 or 8 is described in claim 9. The hard-soldering can take place by local heating to a temperature in the order of 500 to 800° C. A very strong connection is hereby obtained in very simple and per se known manner which can withstand the high pressures in the order of 15-20 bar which occur in compressor coolers and air-conditioning systems. The same advantage is obtained with the embodiment of claim 6 which owing to its nature can very readily withstand said occurring high pressures.

Claim 10 relates to a pretreatment which is recommended. Said anodic treatment is an example. Other possible tin-stripping methods can also be considered. Said anodic treatments can however be performed very simply, rapidly and reliably.

An embodiment which is very suitable in applications where only limited requirements are made of the pressure resistance and complete sealing is specified in claim 11.

Claim 12 gives a possible and practical dimensioning of the capillaries.

Claim 15 gives the possible dimensioning of the wires. Tin-plated copper wires are particularly envisaged. Copper is a material with a high coefficient of heat conduction. In this sense silver wires would be even better, but silver has the drawback of being considerably more expensive. Aluminium could also be suitable for the heat-conducting wires. Aluminium has the drawback however of having a heat conduction coefficient which, while being good, is still lower than that of copper. In addition, it is difficult to connect aluminium wires in reliable manner and in metallic contact to the capillaries in heat conductive manner. In the case of tin-plated copper this can be easily realized with a soldering process. During the production process a mat consisting of capillaries and wires of tin-plated copper can thus be heated to above the melting point of the tin. The adhesion at the contact zones is hereby brought about by soldering.

Claim 16 relates to an important aspect which states in essence that the heat exchanger of the housing according to the invention can be operated in counter-flow. As is known, counter-flow provides the greatest efficiency, greater than crossflow such as is known from, among others, the earlier publications referred to at the beginning of this specification. In respect of claim 16 it must of course be appreciated that there is no counter-flow in the strict sense of the word, but an "effective" counter-flow wherein the capillaries do extend in transverse direction relative to the flow direction of the air but adjacent capillaries have a difference in temperature corresponding to counter-flow.

The heat exchanger of the housing according to claim 17 comprises a number of mutually parallel mats. It will be apparent that the inlet of each mat must be connected to the inlets of the other mats, for instance by a shared main inlet manifold. The outlets of the mats must be connected to each other by means of a main outlet manifold.

Claim 18 relates to the housing with a heat exchanger according to claim 17. According to claim 18, the spacers can be the manifolds. To the extent there are local temperature differences between the manifolds, these must be thermally insulated from each other. The mats and the associated manifolds are however preferably identical and connected in parallel to each other in all respects. There need then be no fear of unintentional heat transfer and thermal insulation between the manifolds is not therefore necessary.

In per se known manner the spacers according to claim 17 and the manifolds of claim 18 can be held against each other. The mats can for instance be formed into a stack and the spacers are pressed against each other by means of clamping means.

Claim 19 relates to the housing with a heat exchanger according to claim 7. This has no manifolds but strengthening profiles on either side of the mat. These can also serve as spacers. An air duct wall can also be dimensioned in which slits hold the U-bends of the capillaries in their position.

Claim 20 provides the option of a forced drive of the air flow.

NL-A-93 01439 describes a heat exchanger with thin wires. Such heat exchangers can transfer heat in economic manner from water to air or from air to water, when the difference in temperature amounts to only 3-5° C. What is important is that they do this while making use of an amount of electrical energy amounting to only a few percent of the transferred heat. This means that a heat pump or cooling mechanism is no longer necessary and energy savings are greatly improved. A considerable amount of fuel normally used for heating can be saved in this manner. At the time this was considered a breakthrough in climate control technology.

NL-C-10 12114 describes a heat exchanger with thin wires which comprises a radial fan. This is enclosed by strips or mats of a fabric consisting of thin copper wires as warp and copper capillaries as weft, wherein each wire is soldered to each capillary in the strip or mat. All capillaries are connected to a water inlet manifold and a water outlet manifold, both having the form of toroidal tubes disposed around the fan. According to this known art the air is blown between the strips or mats. This therefore corresponds at least partially with the above described crossflow principle.

According to a very important aspect of the invention, the housing has the special feature that the medium is one of the group comprising: groundwater, water drawn from the mains water supply, sewage water, water from an underground river, surface water and water from an aquifer, i.e. a water-containing ground layer.

According to a determined aspect of the invention, this latter variant can have the special feature that the medium flows directly through the heat exchanger.

In the case where problems are expected with for instance erosion, contamination or the like as a result of the nature and/or the composition of the medium from said group, the housing according to the invention can comprise: a second heat exchanger of the liquid-liquid type which is connected in one shared medium circuit to said first heat exchanger, through which circuit flows a heat transport medium, for instance a liquid such as water, a liquid-vapour mixture and/or a gas such as air, the surface of which second heat exchanger is in direct contact, on the side remote from said circuit, with a medium from said group.

An embodiment has been found to be very suitable in which the source or the supply of said medium is situated at a depth under the ground surface of a minimum of 3 m. In principle no limit is imposed on said depth. Depths up to 50-100 meters can be envisaged and applied within the scope of the invention.

It is noted that water removed from an underground source of medium will generally have to be replenished. This can take place by injecting the heated return water back into the ground. In some conditions, particularly in the case of large cooling capacities, use is made of an embodiment wherein medium is transported from a supply of this medium to the medium inlet of the heat exchanger, is transported therethrough and transported out of the medium outlet, wherein the medium inlet is in direct contact with a supply of medium from said group, and the medium outlet is in direct contact with either the same or another supply of medium from said group, and wherein an additional cooling device, for instance a cooling tower, is arranged between the medium outlet and the medium inlet.

Brief attention is now given to the heat transfer from water to copper. For practical and economic reasons the capillaries to which the thin wires are attached have an outer diameter in the order of 2 mm and an inner diameter of 1 mm. See claim 12 in this respect. In a warm and humid environment with an economic air velocity of several meters per second in the heat exchanger, the necessary heat transfer between the cooling water and the inner wall of these capillaries, as well as the heat conduction along the thin wires, require a centre-to-centre distance between the capillaries in the order of only 4 to 6 mm. This makes weaving of the wires unattractive, since a weave intersection will occur between each set of nearby capillaries. At this position the wires lie very closely to each other, this resulting in a low heat transfer to the flow-by air. It is therefore considerably more effective for the wires to extend in two groups parallel to each other on either side of the capillaries, whereby the intersections of a fabric are avoided.

A considerable part of the cost of a cooler is for the medium-tight insertion of the thousands of capillaries in a sub-manifold for the purpose of connecting them to the medium flow, normally a water flow. For economic reasons each manifold can be embodied as an inexpensive polyethylene tube. An effective construction is specified in claim 11. PE is a very cheap and highly usable material. Some small leakage to the outside is not a problem; water is after all available in abundance in most applications.

It is a further advantage to choose the diameter of each sub-manifold, i.e. a manifold of one heat exchanger, so that it is the same as the desired centre-to-centre distance of the mats. The sub-manifolds lying tightly against each other can hereby together form the wall of the air duct. Reference is made in this respect to claims 17 and 18.

It has been found very advantageous to make use of the difference in temperature between the ingoing and outgoing water in order to also realize a great difference in temperature of the inflowing and the outflowing air. This reduces the airflow and thereby the necessary fan capacity, improves the condensation by decreasing the air temperature below the dew point, and equalizes the difference in temperature between water and air over the whole heat exchanger.

This effect can be realized in accordance with claim 5 by blocking the water flow (in fact generally the medium flow) in the pipes of the sub-manifolds a total of three to five times on both sides of the mat in order to force the water flow in effective counter-flow relative to the airflow. The optimum number of theoretical units or $N_{TU}$ of the heat exchanger is about 1, and if the flow is blocked more than once the blocks can leak a little without reducing too much the effective $N_{TU}$. It is essential to block an odd number of times in order to realize two open ends on one sub-manifold and two closed ends on the other.

The centre-to-centre distance between the sub-manifolds equals the diameter of the sub-manifolds, and this has the result that it is not possible to connect all sub-manifolds to the same two main inlet and outlet manifolds. It is necessary to make use of four manifolds, i.e. two inlet manifolds and two outlet manifolds, such that there is space between the holes which mutually connect the ends of the sub-manifolds. The main manifolds can likewise be manufactured from a plastic, such as PE, with perforations having a smaller diameter than the outer diameter of the sub-manifolds, whereby these sub-manifolds can be pressed into these perforations. This is a very simple connection that has proven itself in drip irrigation technology.

Several aspects of the application of the heat exchanger according to the invention in heat pump systems is now briefly discussed.

The "Coefficient of Performance" (COP) of a heat pump such as is for instance used for coolers is greatly dependent on the temperature drop over the heat exchangers of the evaporator and the condenser.

Heat exchangers known heretofore cannot be used directly for the media of condensing or evaporating heat pumps. Flat copper manifolds cannot withstand the occurring high pressures and for safety reasons the connections between the capillaries and the manifolds must therefore be realized by hard-soldering. See claim 9 in this respect.

For pressures of more than 4 bar a metal manifold is required in the form of a round tube to which the capillaries are connected by hard-soldering at a temperature of for instance 500° C. This cannot be realized with capillaries of only 15 cm long, since there are simply too many ends requiring a hard-soldering operation. Also underlying the invention therefore is the objective of solving this problem. This solution has been found in the measures according to claim 6. The flow of medium is considerably smaller than in the case of water with a difference in temperature between the inlet and outlet of several degrees Celsius, since the volume of latent heat or cold is so much greater. Even if the capillary is many meters long, the pressure drop in the two-phase medium still does not impede good operation of the heat exchanger.

On the basis of these long tubes curved in a zigzag it is not possible to use a weaving process to arrange the wires. The width of the weaving machine is not large enough and weaving of a long capillary back and forth to a weft of more than 1000 thin wires is technically impossible at this moment. It is therefore necessary to model the long capillary tube into a zigzag construction of mutually parallel, equidistantly placed capillaries in order to cover a space of for instance 15×15 cm with a centre-to-centre distance between the capillaries of for instance 12 mm, whereby a mat with only two end zones is realized instead of a mat with thirty end zones to which should be connected manifolds each having thirty perforations. These end zones are stripped of tin in anodic manner in an acid or base environment and then connected by hard-soldering to the relevant manifold.

The mat can then be connected by hard-soldering to the thin round copper tubes which carry the working medium to and from the compressor.

Practically all coolers operate to date with tube-fin heat exchangers. These have hard copper tubes of a large diameter. They would otherwise buckle under the compression forces necessary to press the aluminium fins onto the tubes. The evaporator and the condenser thus have a very considerable volume of working medium. For safety reasons this large quantity of working medium may not be flammable. Use is made for this reason of fluorinated and even chlorinated compounds which are however problematic due to environmental considerations. In a thin wire heat exchanger applied in combination with a housing according to the invention there are no thick tubes and, due to the low volume, use can be made of propane or butane, and the total active volume of working medium can be reduced to minimal proportions, for instance the amount of a holder for filling lighters, which are commercially available everywhere and are so small they are deemed completely fireproof. A very small volume of the heat exchanger is obtained particularly with the construction according to claim 6.

A mat of for instance 15×15 cm² which is only connected at its two thin ends is mechanically not sufficiently stable. All 180° bends between the adjacent capillaries must be fixed. For this purpose a rigid structure is used which holds the mat in its place. Reference is made in this respect to claims 7 and 19.

The invention will now be elucidated with reference to the accompanying drawings. In the drawings.

Figure 1:
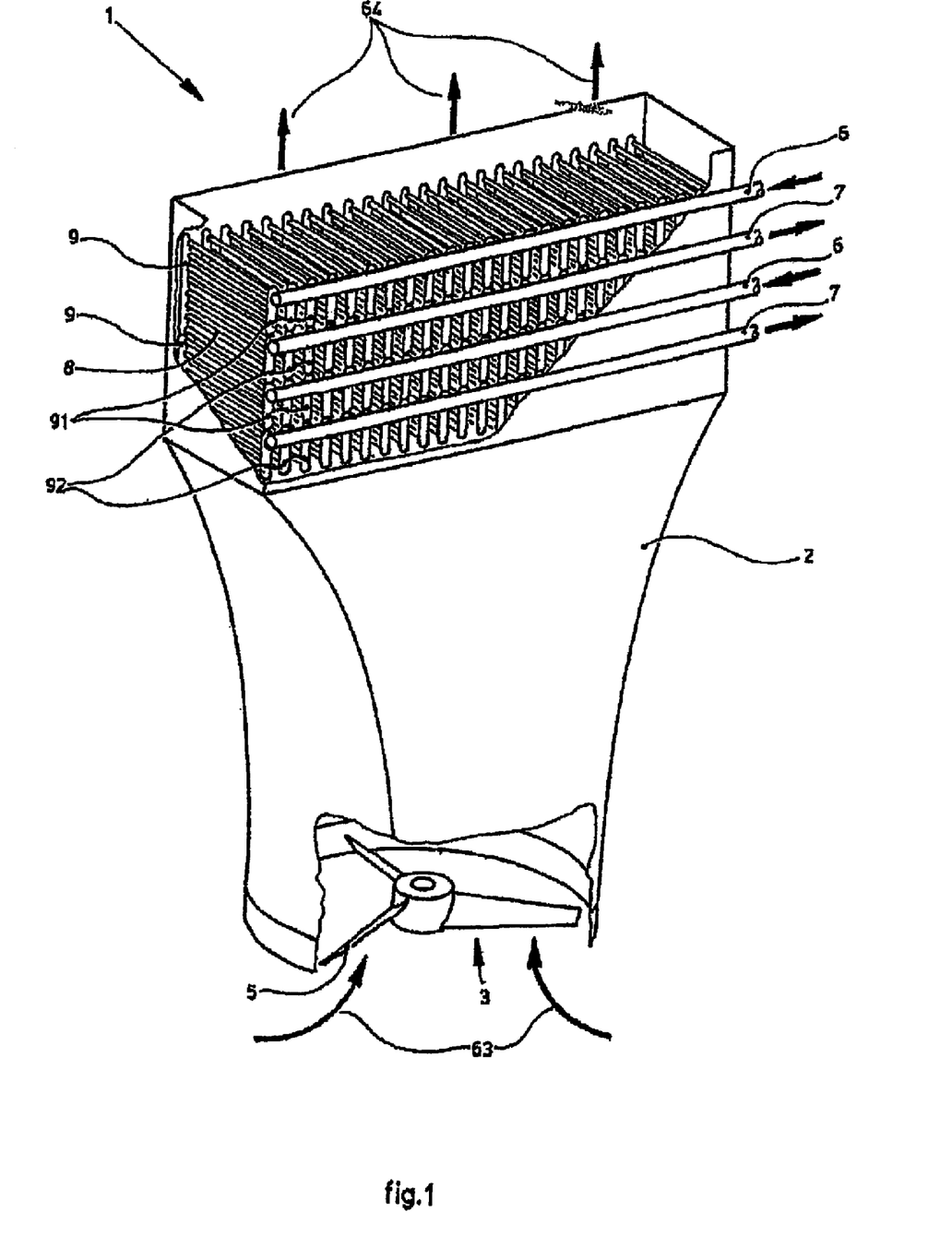
FIG. 1 shows a partly cut-away perspective view of a heat exchanger for a housing according to the invention.

FIG. 1 shows a heat exchanger 1 for use in a housing according to the invention. This heat exchanger 1 according to this random exemplary embodiment has a housing 2 with an air inlet 3 and an air outlet 4. An axial fan 5 is disposed in air inlet 3.

Figure 2:
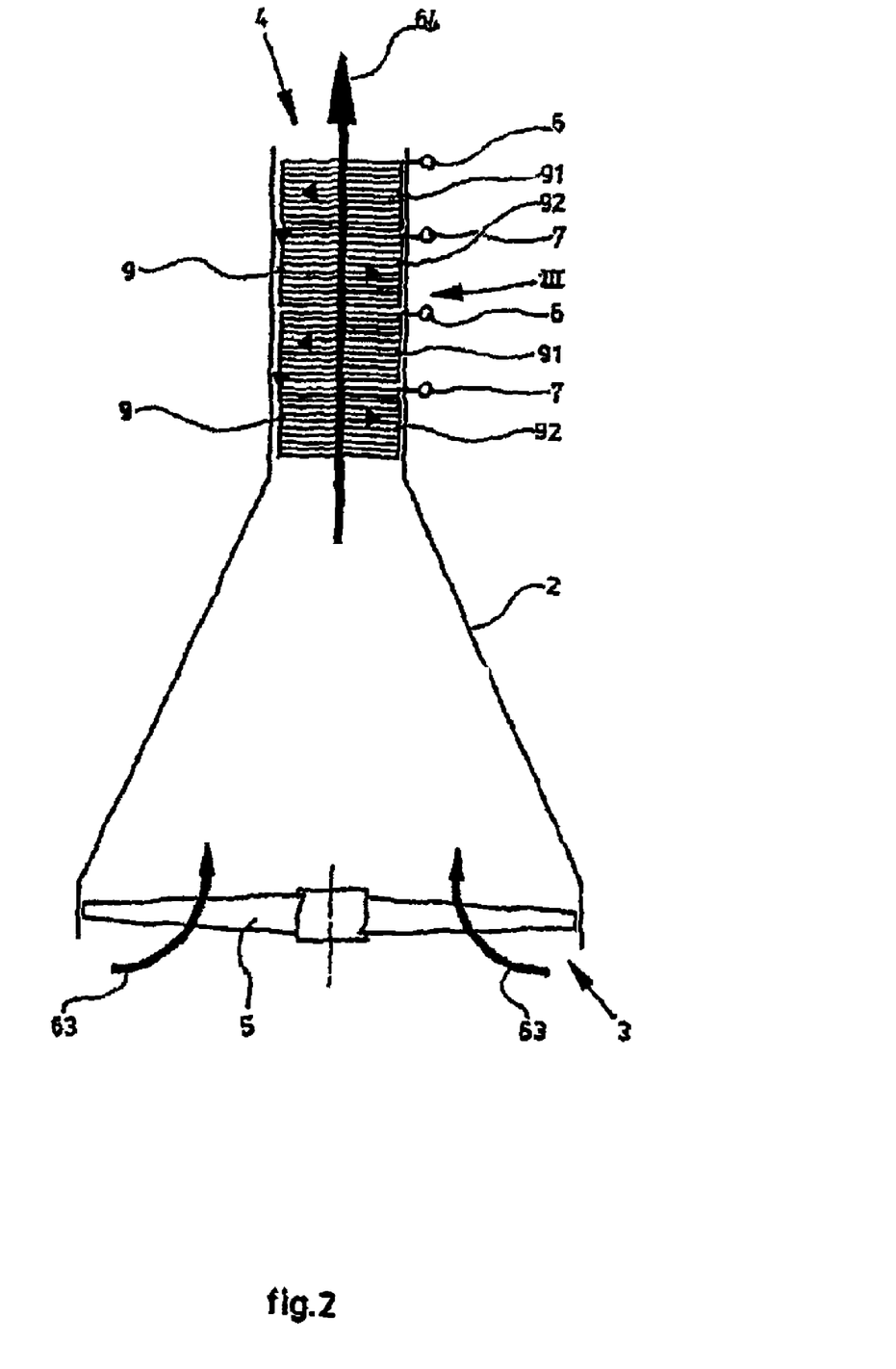
FIG. 2 shows a schematic cross-section through the heat exchanger of FIG. 1.

Two water inlet manifolds 6 and two water outlet manifolds 7 are present in housing 2. Manifolds 6 and 7 are connected via respective sub-manifolds 91, 92 to capillaries 8 disposed in groups in the manner of mats. Capillaries 8 which extend from inlet manifold 91 and to outlet manifold 92 are connected to an intermediate manifold 9 serving respectively as outlet manifold and inlet manifold. Reference is also made in this respect to FIG. 2. This figure also makes clear the manner in which the air 63 is blown by the axial fan 5 into housing 2 via air inlet 3. The air flows along capillaries 8 and leaves housing 2 via air outlet 3, see arrow 64. The water flowing through the capillaries is heated by the air 63, 64, and this air is in turn cooled by the water. It is noted that for the sake of clarity in FIGS. 1 and 2 the thin wires, which form an essential component of the heat exchanger according to the invention, are not drawn. Reference is made in this respect to the figures to be described below.

Figure 3:
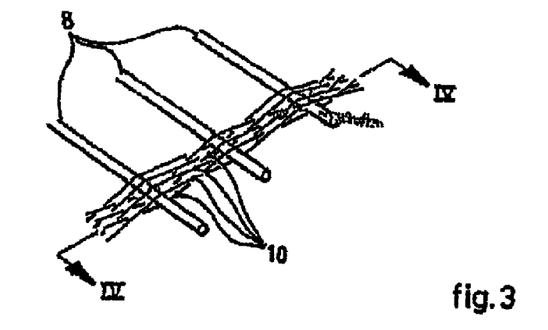
FIG. 3 is a perspective view of a detail of a heat exchanger mat in a first embodiment, wherein a number of wires are omitted for the sake of clarity.

FIG. 3 shows a part of a heat exchanger mat according to the invention. Capillaries 8 are ordered mutually parallel and equidistant with a centre-to-centre distance of about 12 mm. Thin wires 10 are placed interwoven with capillaries 8.

Figure 4:
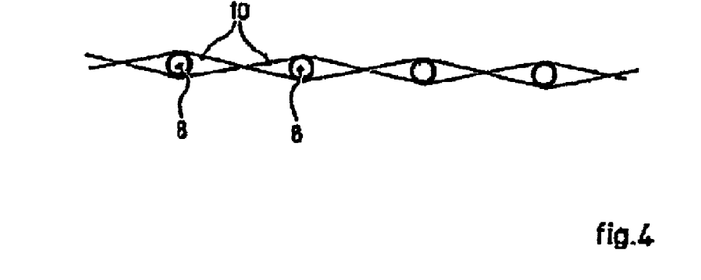
FIG. 4 shows the cross-section IV-IV of FIG. 3.

FIG. 4 clarifies the configuration. The centre-to-centre distance between adjacent, correspondingly placed wires 10 can be equal to or greater than the diameter of wires 10.

Figure 5:
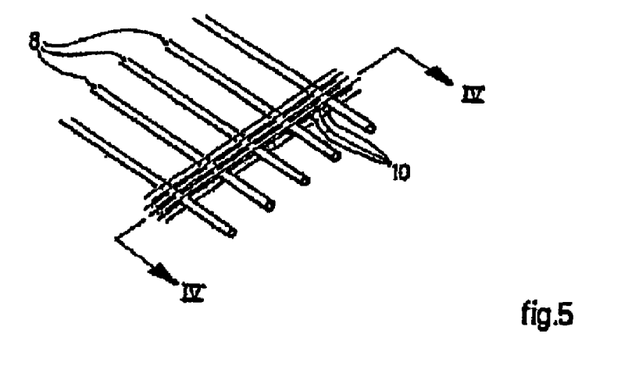
FIG. 5 is a perspective view corresponding with FIG. 3 of a variant;.
Figure 6:
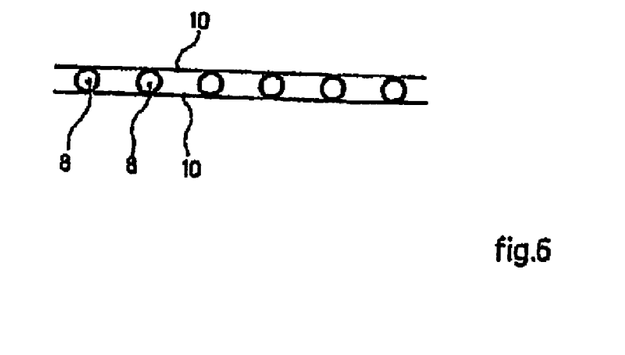
FIG. 6 shows the cross-section VI-VI of FIG. 5.

FIGS. 5 and 6 show an alternative in which wires 10 are not placed interwoven but are arranged in two groups and in mutually parallel relation on both sides of capillaries 8.

It will be apparent that a weaving operation is necessary in the configuration according to FIGS. 3 and 4. This is relatively slow and makes mass production of the heat exchanger problematic. Simpler to manufacture is the heat exchanger in the configuration according to FIGS. 5 and 6. It would appear at this moment that this is more suitable for mass production.

Capillaries 8 consist of copper and are provided on their outside with a tin layer. The wires are also of copper and provided with a tin layer. A soldering operation with local heating is therefore sufficient to realize in a short time an intensively metallic, heat-transferring contact between the capillaries and the wires.

It is important to note that the centre-to-centre distance between capillaries 8 in FIGS. 3, 4 must be greater than the centre-to-centre distance between capillaries 8 in FIGS. 5, 6. This is because the weaving operation for a construction as according to FIGS. 3 and 4 imposes a technically determined lower limit. This lower limit does not exist in the configuration of FIGS. 5 and 6. The heat exchanger based on FIGS. 5 and 6 can hereby be dimensioned more easily in accordance with selected design standards.

Figures 7, 7A:
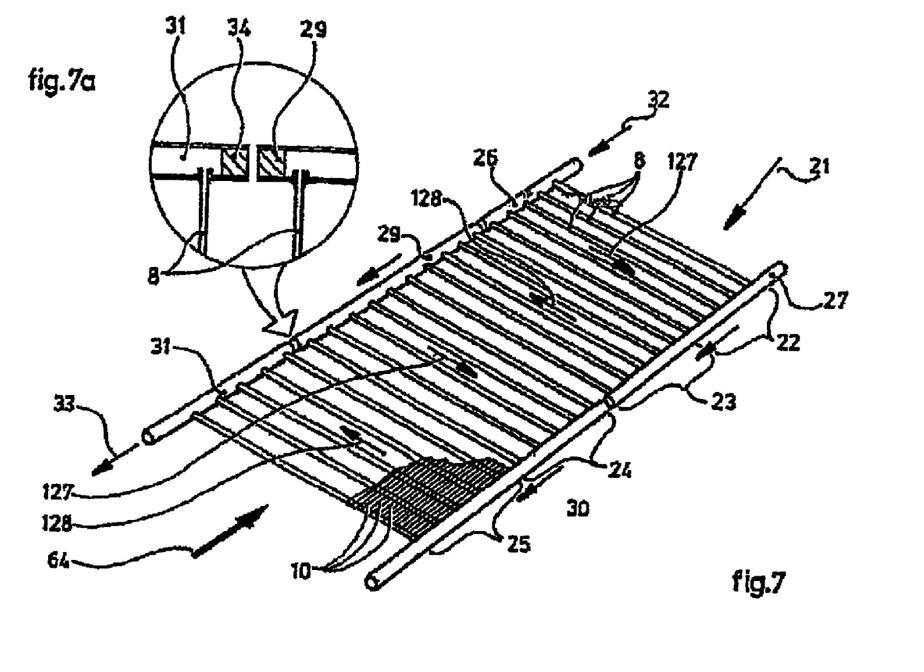
FIG. 7 is a perspective view of a heat exchanger mat in which groups of capillaries are ordered in zigzag manner.
FIG. 7A shows in longitudinal section the detail of FIG. 7 indicated with an arrow.

FIG. 7 shows that capillaries 8 are inserted into tin-plated copper tubes serving as manifolds. They are connected thereto by soft-soldering. Heat exchanger mat 21 as according to FIG. 7 comprises four sections 22, 23, 24, 25. An inlet manifold 26 is connected to five capillaries 8 in which medium flows in the direction of an arrow 127 to a manifold 27, which is also connected to a group of five capillaries 8 of section 23 in which the medium flow takes place as according to an arrow 128, so in opposed direction, to a manifold 29, then via five capillaries to a manifold 30 of section 24, from here to section 25 and five capillaries to an outlet manifold 31. The medium inlet is indicated with an arrow 32; the medium outlet is indicated with an arrow 33. The medium flows in the manifold tubes are also indicated with arrows. The airflow is designated with the reference numeral 64. The air flows on either side of mat 21 in longitudinal direction of wires 10.

FIG. 7A is an enlarged detail in cross-section which shows that there are interruptions between manifold tubes lying in one line. At the position of these interruptions the tubes in question are closed by plugs, generally designated with 34. Tubes 27 and 30 are also closed at the ends with such plugs.

Figures 8, 8A:
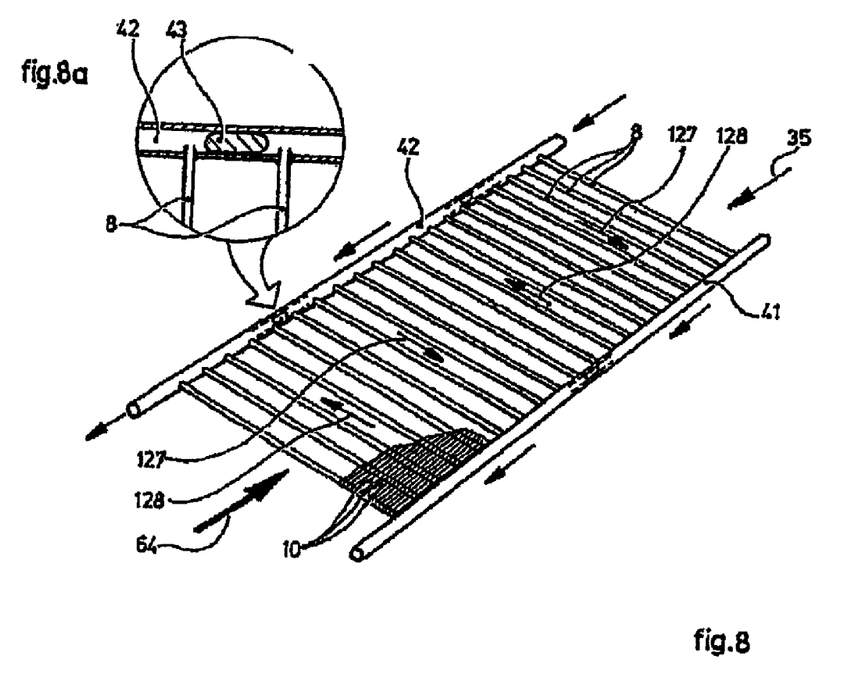
FIG. 8 shows a view corresponding with FIG. 7 of a variant.
FIG. 8A shows in longitudinal section the detail of FIG. 8 indicated with an arrow.

FIG. 8 shows a functionally corresponding variant. The drawn heat exchanger mat 35 functions in the same manner as mat 21, but the manifold tubes 41 and 42 consist of polyethylene or other thermoplastic material with a low heat conduction. During the production process each of the tubes is cut open on one side in longitudinal direction, whereafter the ends of capillaries 8 are placed in the cuts and the material of the tube is then melted at that position by local heating such that in the manner shown in FIG. 8 capillaries 8 are connected substantially sealingly to both manifold tubes 41, 42. Instead of the interruptions and the plugs 34 in the embodiment according to FIG. 7A, a plug 43 is inserted locally as according to FIG. 8A. The ends of tube 41 are also closed by respective plugs.

Figure 9:
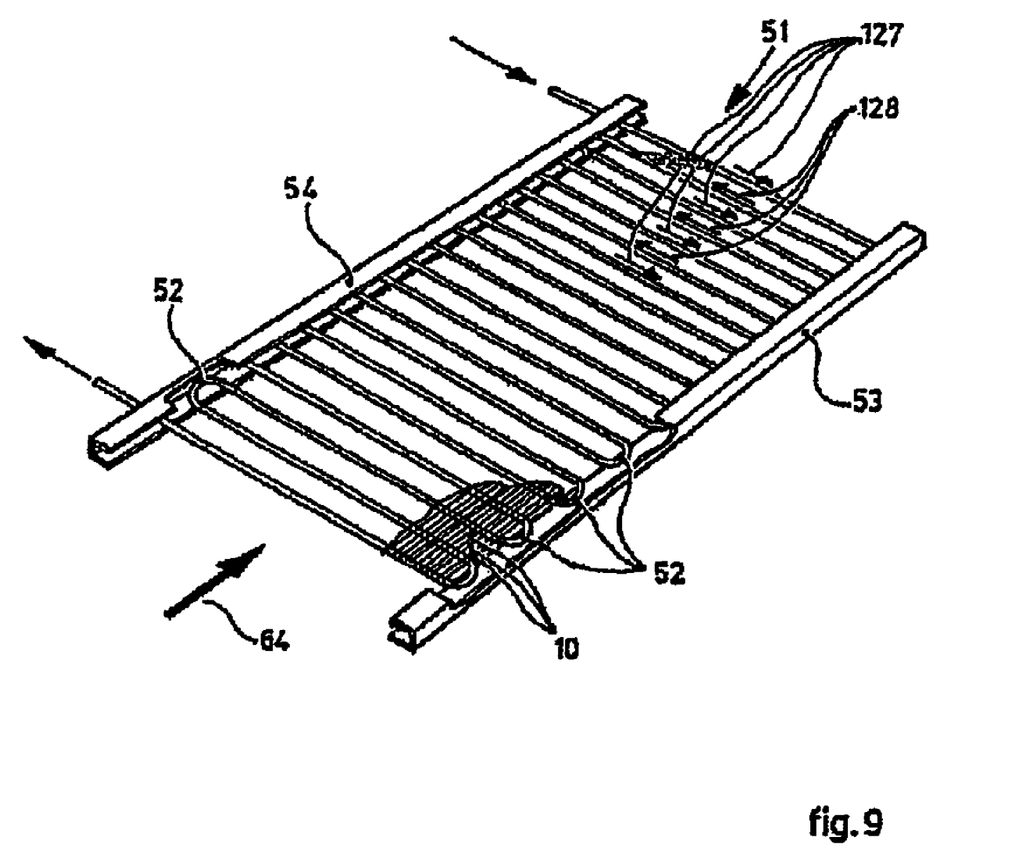
FIG. 9 shows a view corresponding with FIGS. 7 and 8 of a further embodiment.

FIG. 9 shows a heat exchanger mat 51 in an important alternative embodiment. In this embodiment capillaries 8 are formed from one capillary tube modelled into a zigzag shape, wherein each end of each capillary is connected via a U-shaped curved part 52 to the end of an adjacent capillary. These U-shaped curved parts of both sides of mat 51 are in register and connected mechanically to each other by means of respective strengthening profiles 53, 54 with a low heat conduction, for instance of plastic.

The inlet zone 101 and outlet zone 102 of the capillary tube forming capillaries 8 and the U-shaped parts 52 are connected in pressure-resistant manner by hard-soldering to respective manifolds (not drawn), to which further heat exchanger mats are also connected in the same manner.

Figure 10:
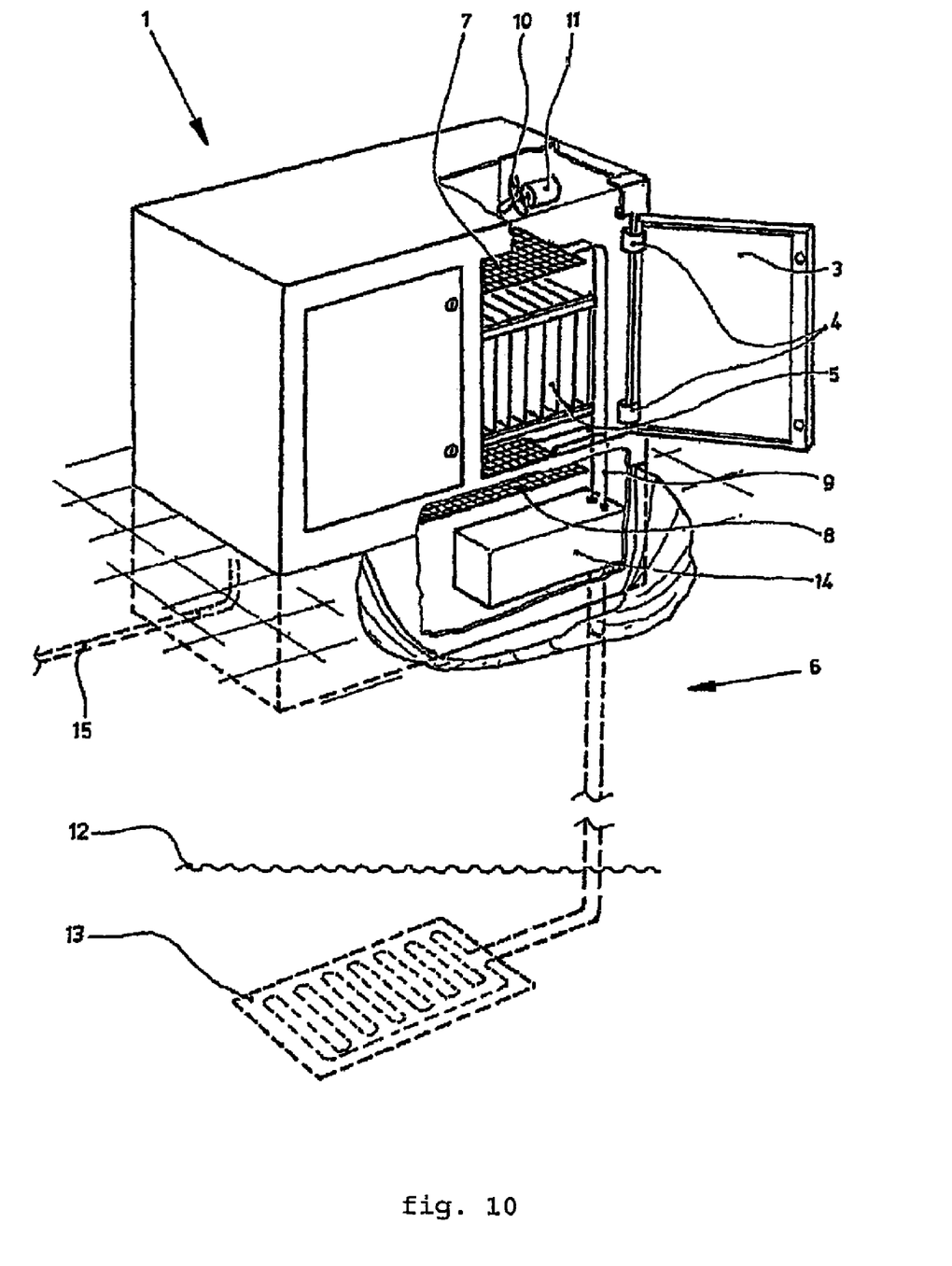
FIG. 10 is a partly cut-away perspective view of a housing according to the invention in a first embodiment.

FIG. 10 shows a housing 1 which is closed during operation and has doors 3 which are arranged on housing 1 with hinges 4. Electronic equipment 5, which dissipates heat during operation, is arranged in housing 1. This can for instance be ADSL equipment. Such equipment is used for data traffic between a group of end users and an exchange. A common embodiment dissipates heat with a power in the order of 1-2 kW. This heat must be discharged, at least to the extent that overheating of the electronic equipment cannot occur. It must be generally assumed that there is a risk of electronic equipment no longer functioning, or no longer functioning correctly, above a temperature of about 40° C. In summer conditions, wherein the ambient temperature can amount to for instance 30°-35°, and with little wind and full in the sun the temperature of the housing can rise further, it is evident that an effective cooling is essential.

A data cable 15 is connected directly or indirectly to a data exchange and is coupled in a manner not shown to electronic equipment 5 in housing 1. Cable 15 also comprises cores for electric power supply to the equipment 5. Data communication can take place via electrical means, but use can also be made of optical communication using for instance glass fibre technology.

Housing 1 comprises cooling means. In the four drawn embodiments these comprise a first heat exchanger 7 arranged above electronic equipment 5 for discharging the heat from rising hot air, and a second heat exchanger 8 placed on the underside of equipment 5 for the purpose of cooling the circulating air. The air in the closed housing 1 circulates under the influence of a fan 10 driven by an electric motor 11.

Heat exchangers 7 and 8 do not necessarily always have to be applied in combination. In some conditions, particularly in the case of smaller cooling capacities, it is possible to suffice with one of the two.

What is however essential according to the invention is that the applied heat exchanger is of the above described type according to the invention, i.e. the so-called thin-wire type. It is also essential that the thin-wire exchanger is disposed relative to the flow-by air such that the air flows substantially in longitudinal direction along the wires. The heat exchanger is preferably further embodied such that it effectively functions in counter-flow.

Heat exchangers 7 and 8 in the exemplary embodiment according to FIG. 10 are connected to conduits 9 for heat transport medium. These conduits extend to an underground source 12 for such a medium, for instance groundwater, an underground river, an aquifer or the like. Alternatively, use can also be made of a connection to the mains water supply.

In the embodiment according to FIG. 10 there is situated in the underground source 12 a third heat exchanger 13 which is connected in one shared cooling medium throughflow circuit to heat exchangers 7 and 8 present in housing 1. This prevents contamination or corrosion of these heat exchangers 7 and 8 occurring as a result of direct contact with the medium from source 12.

It is noted that it is possible to consider using only the heat exchanger 8 under the electronic equipment 5. This prevents the danger of the equipment 5 being adversely affected in the case of leakage of cooling medium from this heat exchanger.

A pump and control unit is arranged in conduits 9 which provides for control of fan 10 and the medium flow in the circuit of conduits 9 such that the temperature conditions of electronic equipment 5 are maintained within safe limits under the most varied conditions.

Figure 11:
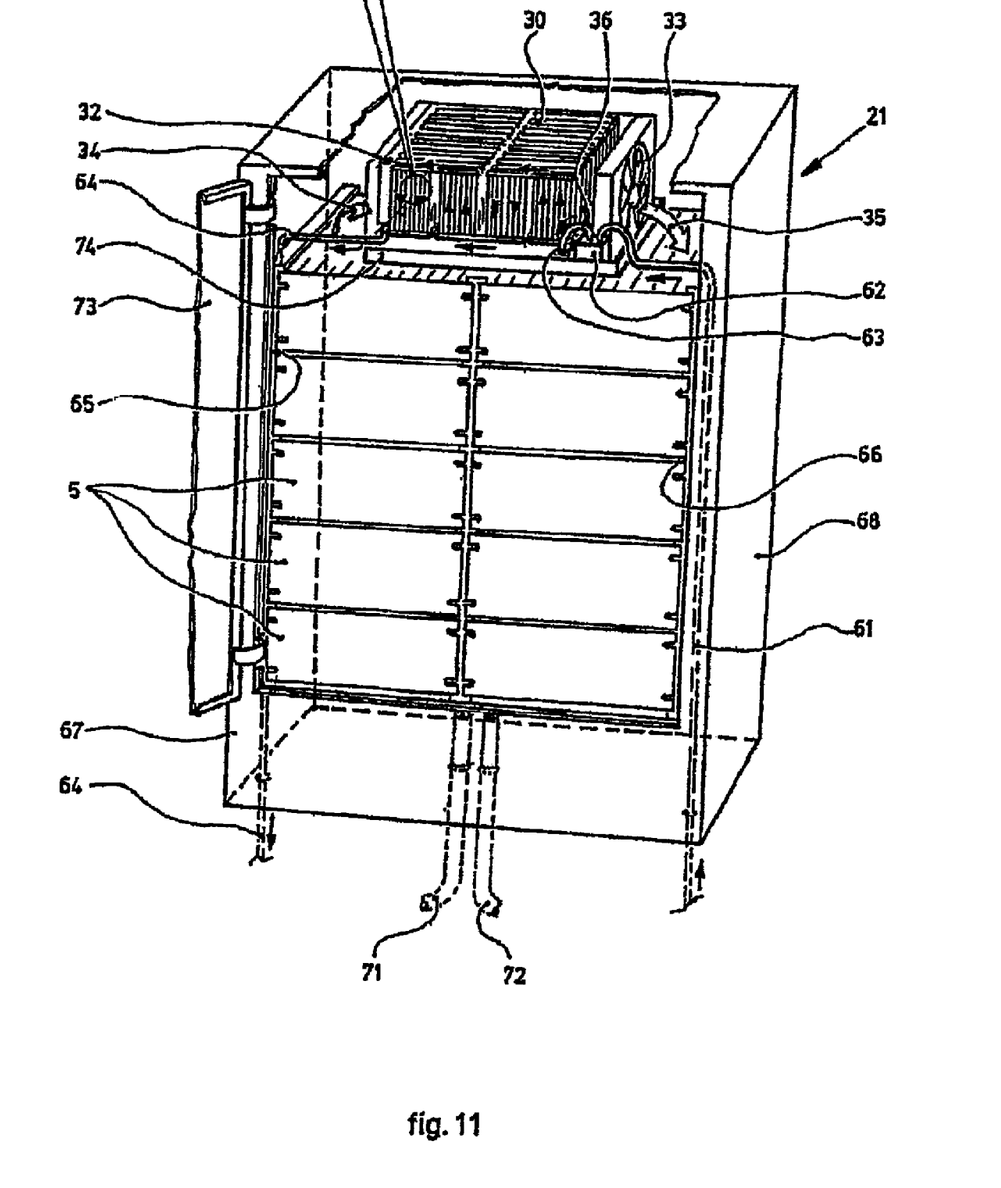
FIG. 11 is a partly cut-away perspective view of a housing in another embodiment.

FIG. 11 shows a housing 21 with a heat exchanger 30 having a fan 32 on its inlet side and a fan 33 on its outlet side 2. A circulating airflow is hereby caused in housing 21. In the airflow to be described below the fans 32 and 33 are in series. Should either of the two fans 32 or 33 malfunction and come to a stop, the operation of the heat exchanger is maintained. There is therefore a technical redundancy here. The infeed side of the airflow in the heat exchanger is designated with 34; the outfeed airflow with 35. The thus generated airflow circulates through the space in housing 21 and thus flows through the racks with electronic equipment 5 for cooling thereof. Via a feed conduit 61, an electric pump 62 and a conduit 63 cooling water flows into heat exchanger 30 via an inlet manifold 33 and, after passing through the heat exchanger and absorbing heat, flows to the outside via an outlet manifold 37, to which connects a discharge conduit 64.

Attention is drawn to the fact that the arrangement of FIG. 11 is such that the air flowing through the heat exchanger 30 flows in controlled manner in longitudinal direction along the wires in accordance with the teaching according to the invention.

Housing 21 is embodied as a casing, wherein the rack with the electronic units 5 is carried by vertical supports 65, 66 lying at a distance from the outer walls 67, 68 of the casing. The intermediate spaces between said outer walls 67 and 68 and the respective supports 65 and 66 are used for, among other things, accommodating respectively discharge conduit 64 and feed conduit 61 in the manner shown in FIG. 11.

A cable 71 for electrical power supply to electronic equipment 5 and a data cable 72 further connect to housing 21.

If during summery conditions, so at a relatively high temperature, door 73 must be opened for some period of time by a service engineer, there is a chance of condensation forming on the heat exchanger 30. In order to prevent condensation water dripping downward and possibly affecting proper operation of electronic units 5 a leakage tray 74 is arranged under heat exchanger 30. This does not in principle have to be provided with a discharge for leakage water. This water will evaporate after a period of time due to the heat coming from the electronic equipment 5.

Figure 12:
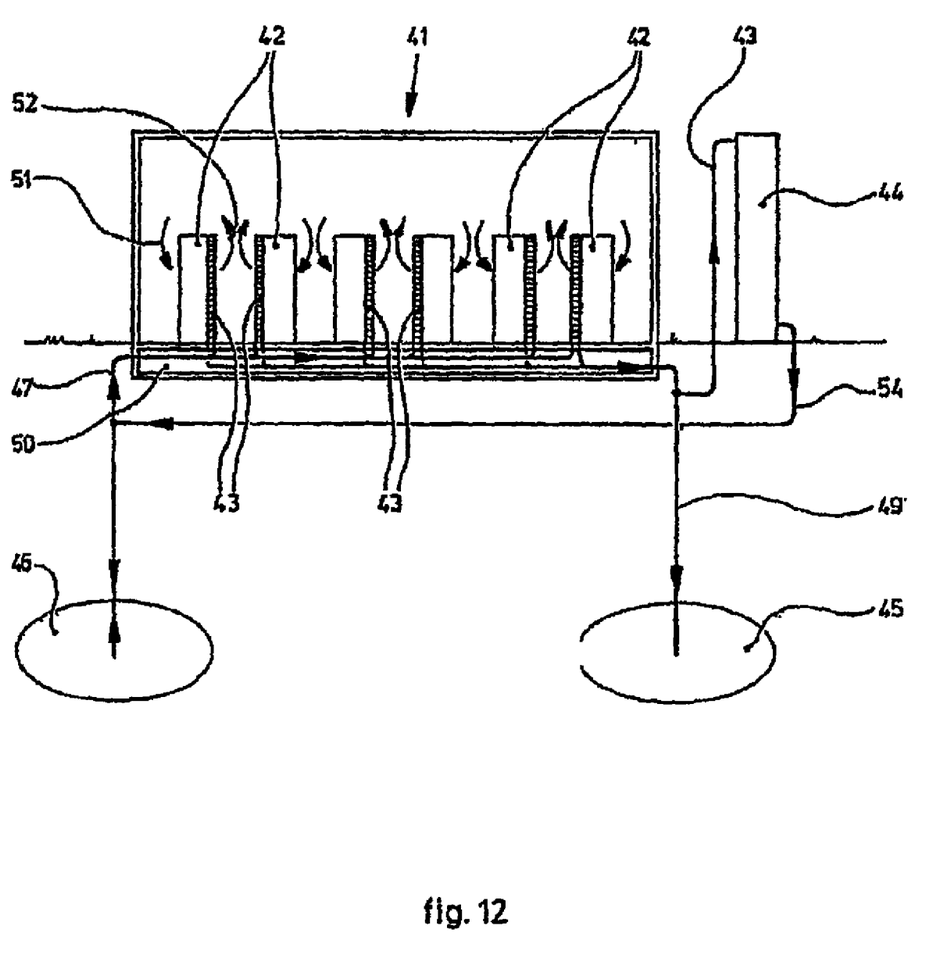
FIG. 12 shows a large housing with computer equipment which is cooled by water from aquifers, and an additional cooling tower.
Figure 13:
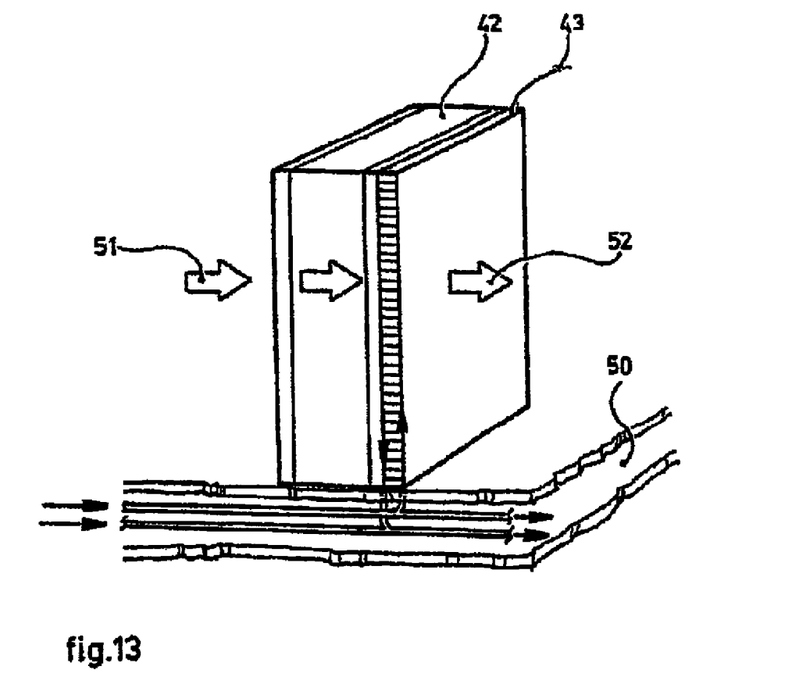
FIG. 13 is a perspective view of a detail of the housing according to FIG. 12.
Figure 14:
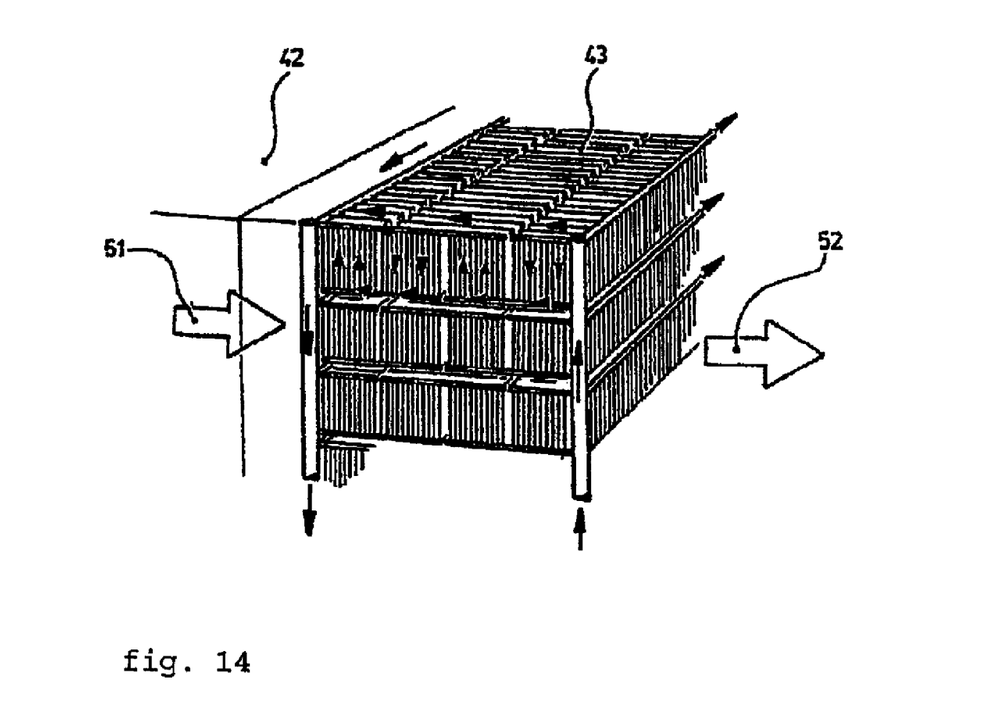
FIG. 14 is a perspective view of a detail of FIG. 13.

FIGS. 12, 13 and 14 show very schematically a housing 41 of a data centre which generates a heat output in the order of magnitude of for instance 10 MW. A heat exchanger 43 is added to each electronic unit 42 in accordance with the teaching of the invention. Cooling water is carried via a conduit 47 out of a cold aquifer source 46 to heat exchangers 43 by means of pump means (not shown). Heated cooling water is injected back into the ground via a return conduit 49, here into a "hot aquifer source" 45.

Since the capacity to be discharged is very large, it is desirable to make use of additional cooling. Used for this purpose is a cooling tower 44 which receives heated water from heat exchangers 43 via an inlet 43, cools this water in per se known manner and feeds it back to conduit 47 via an outlet 54. The flow of indrawn air is designated with 51; the blown-out air is designated in FIG. 12 with reference numeral 54. The figure also shows the manner in which the electronic units 42 are placed back-to-back in order to realize the most efficient cooling of the circulating air.

Equipment 42 is placed on a hollow floor 50 through which the diverse conduits run.

FIG. 13 shows a perspective view, on enlarged scale and in more detail, of the construction of an electronic unit 42 with heat exchanger 43 coupled directly thereto. It is noted that for the sake of clarity no fan means are drawn.

FIG. 14 shows a part of heat exchanger 43 on enlarged scale. On the basis of the detailed description above with reference to the relevant drawings, the manner will be apparent in which the thin-wire heat exchanger must be constructed and configured in accordance with the teaching of the invention.

In each embodiment of the invention the heat exchanger is designed and placed such that it functions effectively in counter-flow relative to the air flowing therethrough. As described above, this is not strictly a counter-flow but an "effective" counter-flow, which does however produce excellent results and makes possible the application of the very advanced thin-wire heat exchanger according to the invention.

Figure 11A:
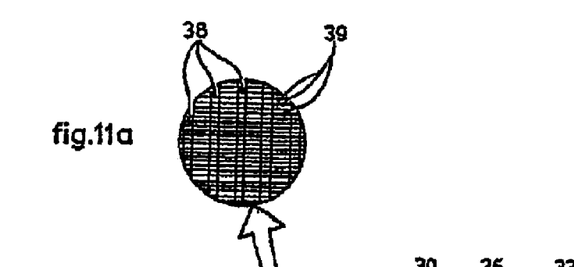
FIG. 11a shows an enlarged detail of FIG. 11.

For the sake of clarity FIG. 11a shows an enlarged detail of heat exchanger 30 at some distance. Shown clearly are the capillaries 38 extending in vertical direction and the wires 39 extending in longitudinal direction. It will be apparent herefrom that the air (infeed air 34, outfeed air 35) flows in longitudinal direction along wires 39.

Owing to the group-wise disposition of the capillaries as shown in FIG. 14 a configuration is realized wherein the medium flows alternately in the one and in the other direction, whereby a discrete version of a counter-flow heat exchanger is realized.

In the water-air heat exchanger of the type according to the invention the NTU (the number of theoretical units) preferably amounts to about 1. At large capacities is it is possible to use the heat stored in the ground partially for the heating of nearby buildings during the heating season.

It is noted that in many countries, including the Netherlands, the temperature of the groundwater has a value in the order of magnitude of 12° C. This enables a very effective cooling in accordance with the teaching of the invention.

Attention is further drawn to the fact that the organization of telephone communications and the like will take a different form in a number of years from now. The telephone exchanges known for many years will disappear and their task will be taken over, in the manner of Internet, by a large number of local cabinets with electronic equipment, which all generate heat and can be cooled in accordance with the teaching of the invention. Since extremely high demands are made in respect of the reliability of electronic equipment of this type, it is important that the temperature in the housing can in principle never form a source of disruption whereby equipment fails. A housing with cooling according to the invention can easily comply with the extremely high demands of durability and reliability.

Finally, it is noted that for instance in FIGS. 11 and 14 the capillaries are drawn in vertical position. There is no technical preference for the position of the capillaries as far as the proper operation of the heat exchanger is concerned. In some conditions it may be advantageous, if the dimensioning of the heat exchanger in relation to the space available for the accommodation thereof gives cause therefor, for the capillaries to extend in horizontal direction. It must however be the aim under all conditions that the airflow for cooling flows at least substantially in longitudinal direction along the wires.

The invention claimed is:

1. A housing for heat-generating electronic equipment, said housing being provided with cooling means for cooling the air present in the housing and for discharging heat coming from the equipment,
    the housing is closed at least during operation;
    the air circulates in the housing during operation by means of fan means; and
    the cooling means comprise a heat exchanger with:
    an air inlet and an air outlet for exchanging heat between passing air and a liquid-containing medium, such as a liquid such as water, or a liquid-vapour mixture, and a gas such as air, which heat exchanger also comprises a medium inlet and a medium outlet and at least one substantially flat heat exchanger mat, which mat comprises:
    a number of capillaries of heat-conducting material, for instance tin-plated copper, disposed in mutually parallel and mutually equidistant relation; and
    a number of wires of heat-conducting material, for instance tin-plated copper which are attached in heat-conducting, preferably metallic contact to the capillaries, extend in mutually equidistant relation in transverse direction relative thereto and have a mutual distance in the order of magnitude of the diameter of the wires;
    wherein under the influence of drive means air can flow along the wires for heat exchange between this air and the medium flowing through the capillaries via the walls of the capillaries and the wires,
    wherein the heat exchanger is embodied such that the air flows along the or each mat and at least a substantial part of the air is prevented from flowing through the mat; and
    wherein the air flows in longitudinal direction of the wires.

2. The housing as claimed in claim 1, wherein the heat exchanger comprises: an inlet manifold and an outlet manifold, between which two manifolds the capillaries extend so that medium can flow therethrough.

3. The housing as claimed in claim 1, wherein the wires contact adjacent capillaries alternately on the one side and on the other side, wherein adjacent wires or groups of wires contact the other sides of the capillaries relative to nearby wires or groups of wires,
    such that the wires or groups of wires are mutually interwoven.

4. The housing as claimed in claim 1, wherein two groups of wires extend in two main planes in mutually parallel relation, wherein the wires of each group contact the same side of the capillaries.

5. The housing as claimed in claim 1, wherein the inlet manifold has at least one interruption or plug, the outlet manifold has at least one interruption or plug placed offset relative thereto such that the medium admitted through the inlet of the inlet manifold is guided successively through a first inlet manifold, the group of capillaries connecting thereto, a first intermediate manifold, a second group of capillaries and so forth, and finally the outlet manifold such that the medium moves in the one direction in zigzag manner in the group of capillaries and moves in opposite direction in the following group of capillaries.

6. The housing as claimed in claim 1, wherein the capillaries are formed from one capillary tube modeled into a zigzag shape, wherein each end of each capillary is connected via a U-shaped curved part to the end of a nearby capillary, wherein the end zones of the capillary tube are connected to respective tubes acting as manifolds.

7. The housing as claimed in claim 6, wherein the U-shaped curved parts of both sides of the mat are in register and coupled mechanically to each other by means of a strengthening profile with a low heat conduction.

8. The housing as claimed in claim 2, wherein each manifold is a tube in which a row of perforations is arranged, in which perforations the ends of the capillaries are sealingly inserted.

9. The housing as claimed in claim 6, wherein the tubes consist of metal, for instance tin-plated copper, and the capillaries are connected to each tube by soft-soldering at a temperature of about 300° C. or hard-soldering at a temperature of 500° C.-800° C.

10. The housing as claimed in claim 6, wherein each capillary consists of tin-plated copper and the ends of each capillary are stripped of tin prior to the hard-soldering, for instance by means of an anodic treatment in an aqueous solution of NaOH or HCl.

11. The housing as claimed in claim 1, wherein the housing includes at least two manifolds and wherein each manifold is a tube of thermoplastic material, for instance PP, PE, ABS or EPDM, in which tube a cut is made in longitudinal direction on one side, whereafter the ends of the capillaries are placed in the cut and the material of the tube is then melted at that position by local heating such that the capillaries are connected substantially sealingly to the tube.

12. The housing as claimed in claim 1, wherein the capillaries each have an outer diameter of about 1.8 mm±30% and a wall thickness of about 0.4 mm±40%.

13. The housing as claimed in claim 3, wherein the centre-to-centre distance of the capillaries amounts to about 10 mm±40%.

14. The housing as claimed in claim 4, wherein the centre-to-centre distance of the capillaries lies in the range of about 4-16 mm.

15. The housing as claimed in claim 1, wherein the wires have a diameter of 0.12 mm±50%.

16. The housing as claimed in claim 11, wherein the main flow direction of the medium is an effective counter-flow with respect to the direction of the air.

17. The housing as claimed in claim 1, wherein the heat exchanger comprises a number of heat exchanger mats held by spacers in mutually parallel and equidistant relation.

18. The housing as claimed in claim 17, wherein the spacers are mutually abutting inlet manifolds and outlet manifolds.

19. The housing as claimed in claim 17, wherein the spacers are mutually abutting profiles.

20. The housing as claimed in claim 1, wherein the air is driven by fan means.

21. The housing as claimed in claim 1, wherein the medium is one of the group comprising: groundwater, water drawn from the mains water supply, sewage water, water from an underground river, surface water and water from an aquifer.

22. The housing as claimed in claim 21, wherein the medium flows directly through the heat exchanger.

23. The housing as claimed in claim 21, comprising a second heat exchanger of the liquid-liquid type which is connected in one shared medium circuit to said first heat exchanger, through which circuit flows a heat transport medium, for instance a liquid such as water, a liquid-vapour mixture and/or a gas such as air, the surface of which second heat exchanger is in direct contact, on the side remote from said circuit, with a medium from said group.

24. The housing as claimed in claim 21, wherein the medium is transported from a supply of this medium to the medium inlet of the heat exchanger, is transported therethrough and transported out of the medium outlet, wherein the medium inlet is in direct contact with a supply of medium from said group, and the medium outlet is in direct contact with either the same or another supply of medium from said group, and wherein an additional cooling device, for instance a cooling tower, is arranged between the medium outlet and the medium inlet.

* * * * *